US010763147B2

(12) United States Patent
Taguchi et al.

(10) Patent No.: US 10,763,147 B2
(45) Date of Patent: Sep. 1, 2020

(54) SUBSTRATE WARPAGE DETECTION DEVICE, SUBSTRATE WARPAGE DETECTION METHOD, AND SUBSTRATE PROCESSING APPARATUS AND SUBSTRATE PROCESSING METHOD USING THE SAME

(71) Applicant: TOKYO ELECTRON LIMITED, Tokyo (JP)

(72) Inventors: Junnosuke Taguchi, Iwate (JP); Yuya Sasaki, Iwate (JP); Toshiya Chiba, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 55 days.

(21) Appl. No.: 16/026,395

(22) Filed: Jul. 3, 2018

(65) Prior Publication Data
US 2019/0013225 A1    Jan. 10, 2019

(30) Foreign Application Priority Data
Jul. 7, 2017    (JP) .................... 2017-133979

(51) Int. Cl.
*H01L 21/67* (2006.01)
*G01N 21/95* (2006.01)
(Continued)

(52) U.S. Cl.
CPC ...... *H01L 21/67288* (2013.01); *G01B 11/306* (2013.01); *G01N 21/9505* (2013.01); *H01L 21/68764* (2013.01); *H01L 21/68771* (2013.01)

(58) Field of Classification Search
CPC ......... H01L 21/67288; H01L 21/68771; H01L 21/68764; H01L 22/12; H01L 21/67253;
(Continued)

(56) References Cited
U.S. PATENT DOCUMENTS 3,818,236 A * 6/1974 Lind ..................... D03D 51/28
250/559.43
4,558,723 A * 12/1985 Tanaka ................. D03D 47/367
139/370.2

(Continued)

FOREIGN PATENT DOCUMENTS
JP        20158269 A    1/2015

*Primary Examiner* — Mohamed K Amara
(74) *Attorney, Agent, or Firm* — Nath, Goldberg & Meyer; Jerald L. Meyer

(57) ABSTRACT

A substrate warpage detection device for detecting warpage of a substrate loaded on a substrate loading region having a recess shape formed on a rotary table along a circumferential direction during rotation of the rotary table, includes a light transmitting part configured to transmit a light beam obliquely upward from a side of the rotary table such that a lower portion of the light beam collides with an upper end of a side surface of the rotary table and an upper portion of the light beam positioned more upward than the lower portion of the light beam passes a portion near the surface of the rotary table, and a light receiving part installed to face the light transmitting part and configured to receive the light beam passing the portion near the surface of the rotary table so as to detect an amount of received light.

20 Claims, 12 Drawing Sheets

(51) Int. Cl.
  *H01L 21/687* (2006.01)
  *G01B 11/30* (2006.01)
(58) Field of Classification Search
  CPC ......... H01L 2223/54426; H01L 21/681; H01L 2924/3511; H01L 21/304; G01B 11/306; G01B 2210/56; G01B 11/24; G01B 11/14; G01B 11/00; G01B 21/20; G01N 21/9505; G01N 21/9501; G01N 21/956; G01N 21/9503; G01N 21/9506; G01N 21/896; G08B 17/10; G08B 25/00; H04N 7/18; B60R 1/00; H01J 37/28; B24B 49/12
  See application file for complete search history.

(56) References Cited

U.S. PATENT DOCUMENTS

| | | | | |
|---|---|---|---|---|
| 4,714,315 A * | 12/1987 | Krause | ................ | G02B 6/3825 219/121.13 |
| 5,149,981 A * | 9/1992 | Strandberg, Jr. | ........ | D06B 23/06 250/559.01 |
| 6,031,607 A * | 2/2000 | Miyazaki | ................ | G06T 7/001 356/237.1 |
| 6,094,263 A * | 7/2000 | Tomiya | ................ | G01R 31/308 356/237.1 |
| 7,633,070 B2 * | 12/2009 | Zywno | ................... | H01J 37/20 250/442.11 |
| 8,138,456 B2 * | 3/2012 | Fukuda | ............. | H01L 21/67005 118/725 |
| 8,259,308 B2 * | 9/2012 | Bishop | ................... | A21B 1/48 219/492 |
| 8,563,335 B1 * | 10/2013 | Benvegnu | ............. | H01L 22/12 438/16 |
| 8,582,963 B2 * | 11/2013 | Li | ...................... | F27B 17/0025 118/728 |
| 8,801,891 B2 * | 8/2014 | Tsuruda | .................. | B32B 38/10 156/345.16 |
| 9,535,013 B2 * | 1/2017 | Matsumoto | .......... | G01B 11/303 |
| 9,601,302 B2 * | 3/2017 | Yoshikawa | ........ | G01N 23/2204 |
| 9,601,394 B2 * | 3/2017 | Kodama | .................. | H01L 22/20 |
| 9,929,054 B2 * | 3/2018 | Yonehara | ............. | H01L 21/304 |
| 10,446,423 B2 * | 10/2019 | Su | ........................ | H01L 21/677 |
| 2002/0140120 A1 * | 10/2002 | Suzuki | ................ | B29C 45/0053 264/40.1 |
| 2005/0284579 A1 * | 12/2005 | Ishibuchi | .................. | B31F 1/24 156/359 |
| 2007/0257085 A1 * | 11/2007 | Fukuda | ............. | H01L 21/67005 228/101 |
| 2008/0024773 A1 * | 1/2008 | Miyazaki | ........... | G01N 21/4738 356/237.2 |
| 2008/0171131 A1 * | 7/2008 | Moro | .................. | H01L 21/6875 427/8 |
| 2008/0206902 A1 * | 8/2008 | Bour | ....................... | H01L 22/12 438/14 |
| 2008/0274670 A1 * | 11/2008 | Tada | ....................... | B24B 9/065 451/6 |
| 2009/0027657 A1 * | 1/2009 | Serebryanov | ......... | H01L 21/681 356/73 |
| 2009/0141288 A1 * | 6/2009 | Nishio | ................ | G01B 11/026 356/614 |
| 2010/0302556 A1 * | 12/2010 | Bishop | ..................... | A21B 1/48 356/621 |
| 2012/0006263 A1 * | 1/2012 | Hashimoto | ............. | C30B 25/10 118/712 |
| 2013/0228684 A1 * | 9/2013 | Hatakeyama | ......... | H01J 37/244 250/310 |
| 2016/0131473 A1 * | 5/2016 | Kasai | .................. | G01B 11/026 356/612 |

* cited by examiner

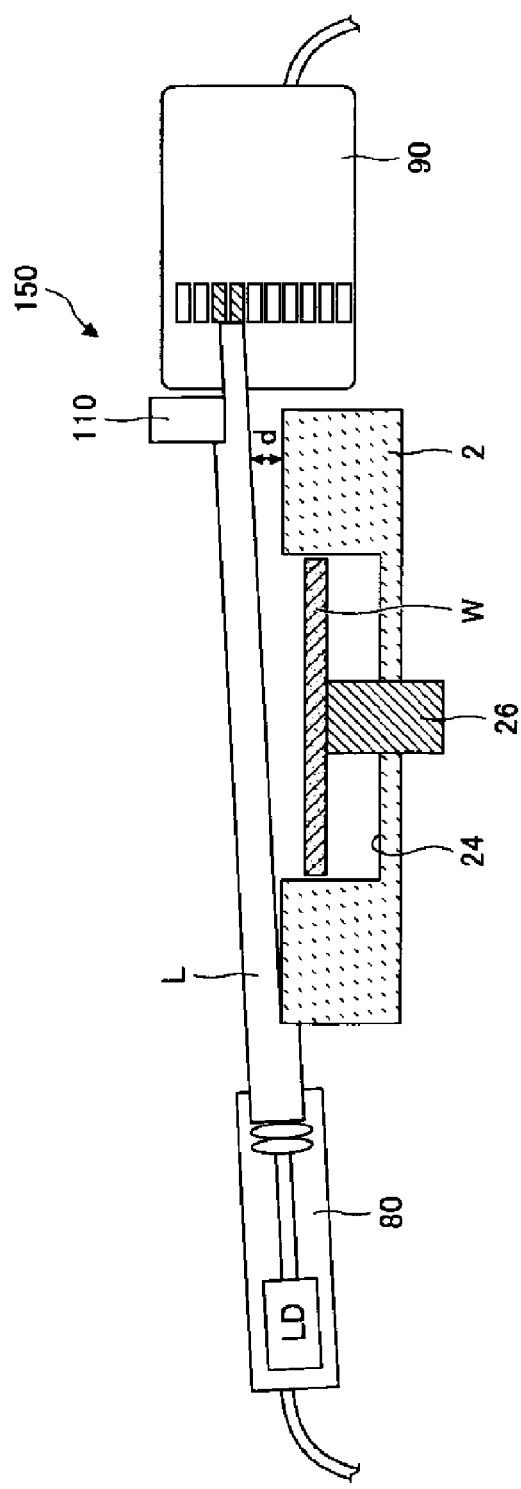

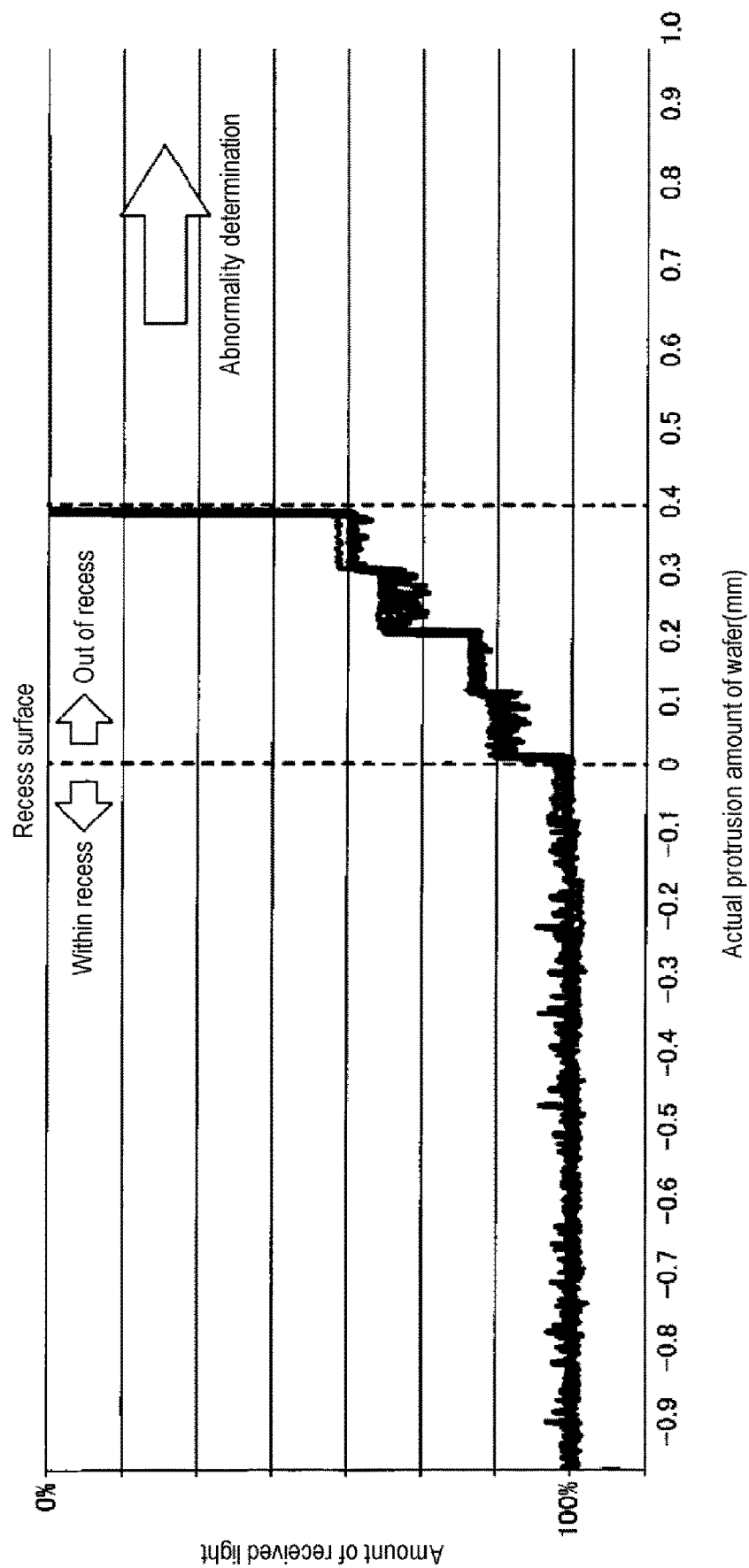

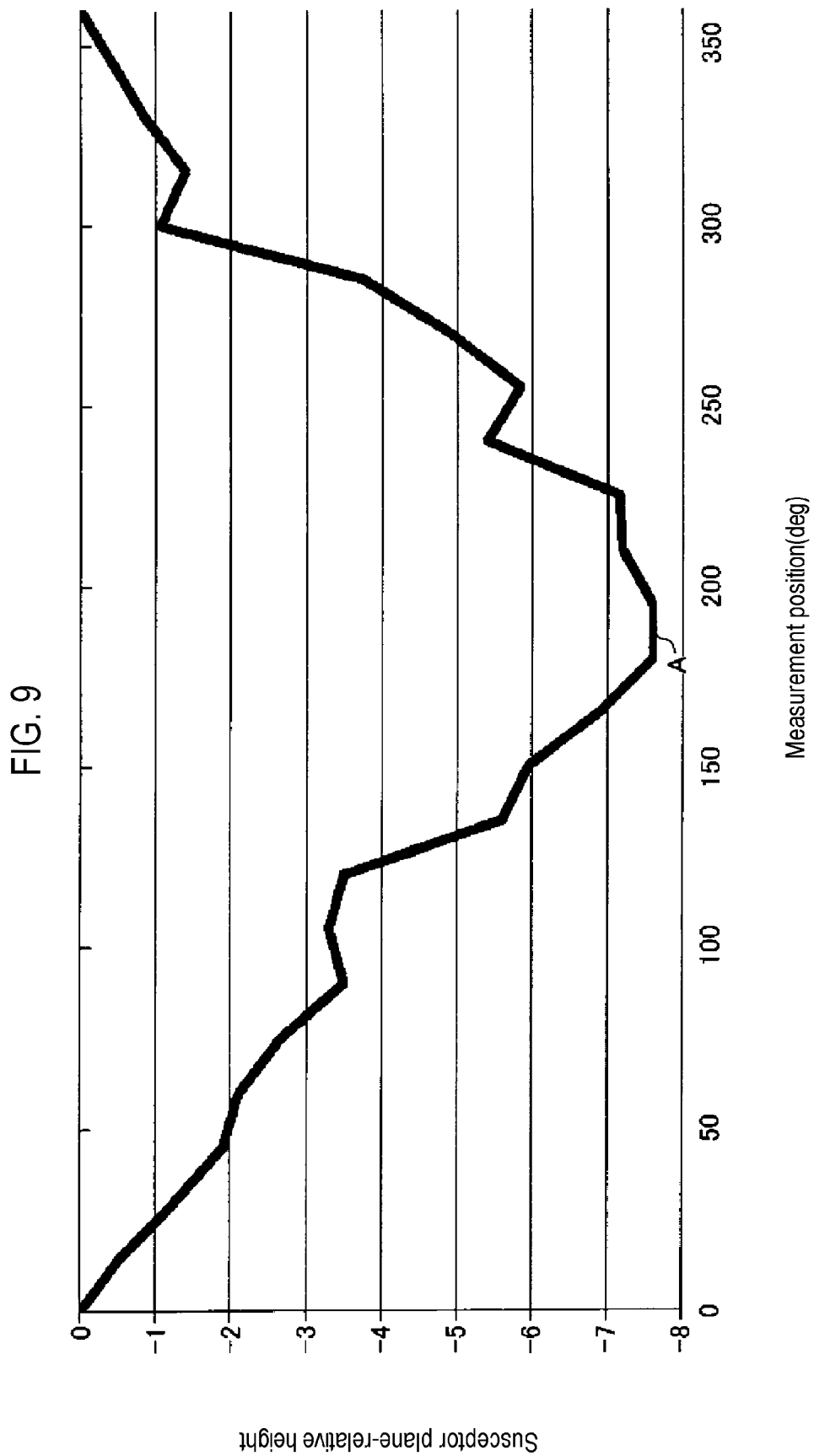

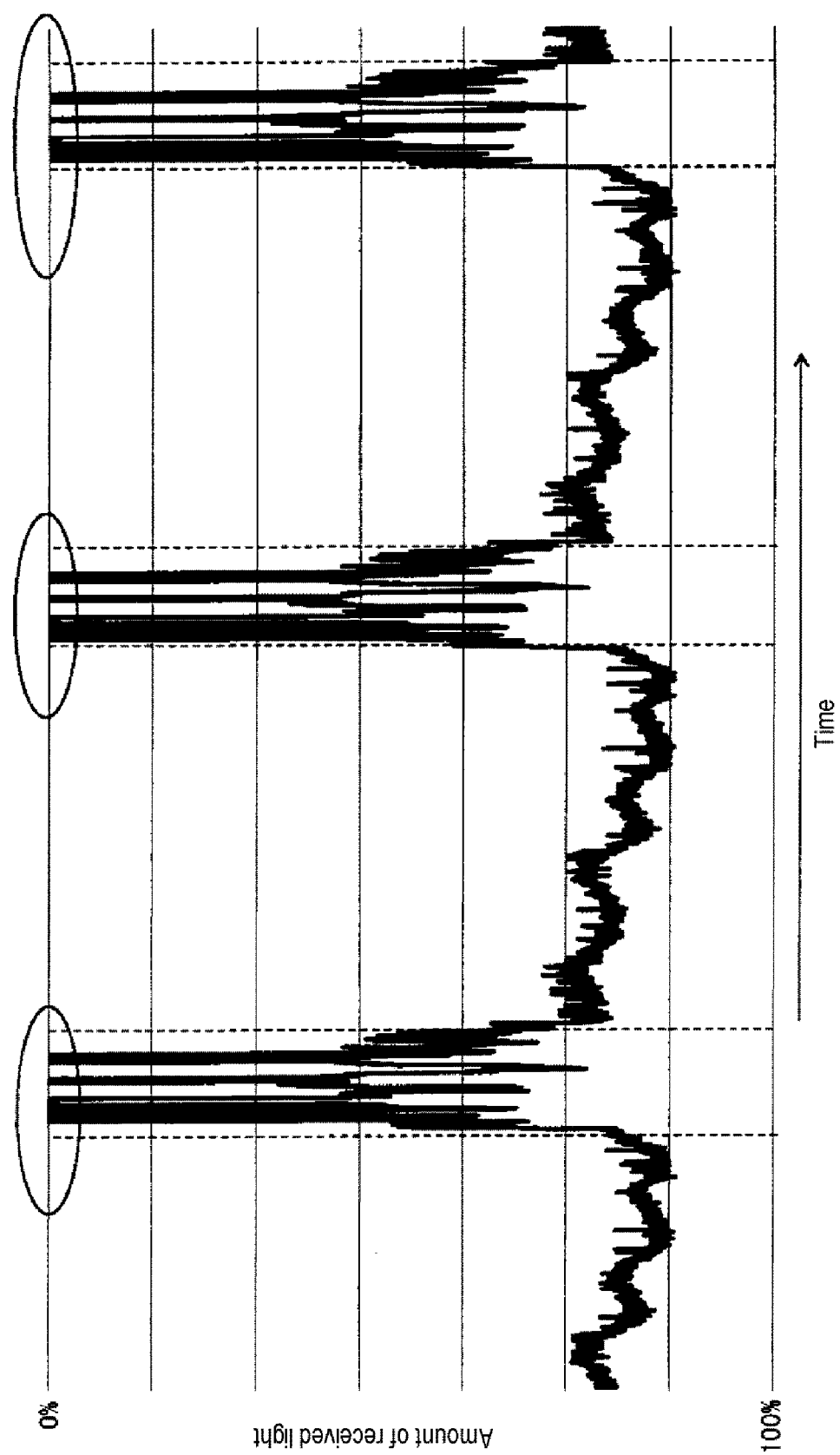

SUBSTRATE WARPAGE DETECTION DEVICE, SUBSTRATE WARPAGE DETECTION METHOD, AND SUBSTRATE PROCESSING APPARATUS AND SUBSTRATE PROCESSING METHOD USING THE SAME

CROSS-REFERENCE TO RELATED APPLICATION

This application is based on and claims the benefit of priority from Japanese Patent Application No. 2017-133979, filed on Jul. 7, 2017, the entire contents of which are incorporated herein by reference.

TECHNICAL FIELD

The present disclosure relates to a substrate warpage detection device, a substrate warpage detection method, and a substrate processing apparatus and a substrate processing method using the same.

BACKGROUND

Conventionally, as a substrate detachment detection device used in a substrate processing apparatus in which substrate processing is performed by continuously rotating a rotary table in a state in which a substrate is loaded on a substrate mounting recess formed on the surface of the rotary table substantially horizontally installed in a chamber, a substrate detachment detection device having a substrate detachment determination means which determines whether the substrate has detached from the recess by determining the presence or absence of the substrate on the recess during the rotation of the rotary table is known.

In this substrate detachment detection device, a radiation thermometer for detecting the temperature of through holes for elevating pins installed in the recess for loading the substrate on the rotary table is installed to detect detachment of the substrate based on a temperature difference, or an imaging means for picking up an image of the recess is installed to detect detachment of the substrate. When the substrate is detached, the rotation of the rotary table is stopped.

However, in the related art, it is possible to detect that the substrate is detached but it is not possible to detect a state of the substrate which has a possibility to be detached but has not yet detached. Accordingly, in the related art, even though it may be possible to reduce damages in the chamber, such as reducing generation of defective wafers or the like by taking measures, it is impossible to completely prevent damages.

SUMMARY

Some embodiments of the present disclosure provide a substrate warpage detection device capable of detecting warpage of substrate having a degree enough to cause the substrate to have a possibility to be detached during rotation of a rotary table and taking measures before detachment of the substrate occurs, a substrate warpage detection method, and a substrate processing apparatus and a substrate processing method using the same.

According to one embodiment of the present disclosure, there is provided a substrate warpage detection device for detecting warpage of a substrate loaded on a substrate loading region having a recess shape formed on a rotary table along a circumferential direction during rotation of the rotary table, the device including: a light transmitting part configured to transmit a light beam obliquely upward from a side of the rotary table such that a lower portion of the light beam collides with an upper end of a side surface of the rotary table and an upper portion of the light beam positioned more upward than the lower portion of the light beam passes a portion near the surface of the rotary table; and a light receiving part installed to face the light transmitting part and configured to receive the light beam passing the portion near the surface of the rotary table so as to detect an amount of received light, wherein the light transmitting part is disposed such that the amount of received light detected by the light receiving part when the substrate loaded on the substrate loading region protrudes upward from the surface of the rotary table by a predetermined height becomes less than a predetermined threshold value.

According to one embodiment of the present disclosure, there is provided a substrate warpage detection method, including: rotating a rotary table in a state in which a substrate is loaded on a substrate loading region having a recess shape formed on an upper surface of the rotary table along a circumferential direction; transmitting a light beam obliquely upward from a side of the rotary table such that a lower portion of the light beam collides with an upper end of a side surface of the rotary table and an upper portion of the light beam positioned more upward than the lower portion of the light beam passes a portion near the surface of the rotary table; and receiving the light beam and detecting an amount of received light of the light beam, wherein the light beam is transmitted such that the amount of received light detected by the light receiving part when the substrate loaded on the substrate loading region protrudes upward from the surface of the rotary table by a predetermined height is detected as a value less than a predetermined threshold value.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a view illustrating an example of the substrate warpage detection device according to the present embodiment.

FIG. 8 is a diagram illustrating results obtained by investigating a relationship between an actual protrusion amount of a wafer W and a detection amount using the substrate warpage detection device according to the present embodiment.

FIG. 9 is a diagram illustrating an example of a difference in height of a surface of the rotary table.

FIG. 10 illustrates results of actually detected warpage of a substrate using the substrate warpage detection device according to the present embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
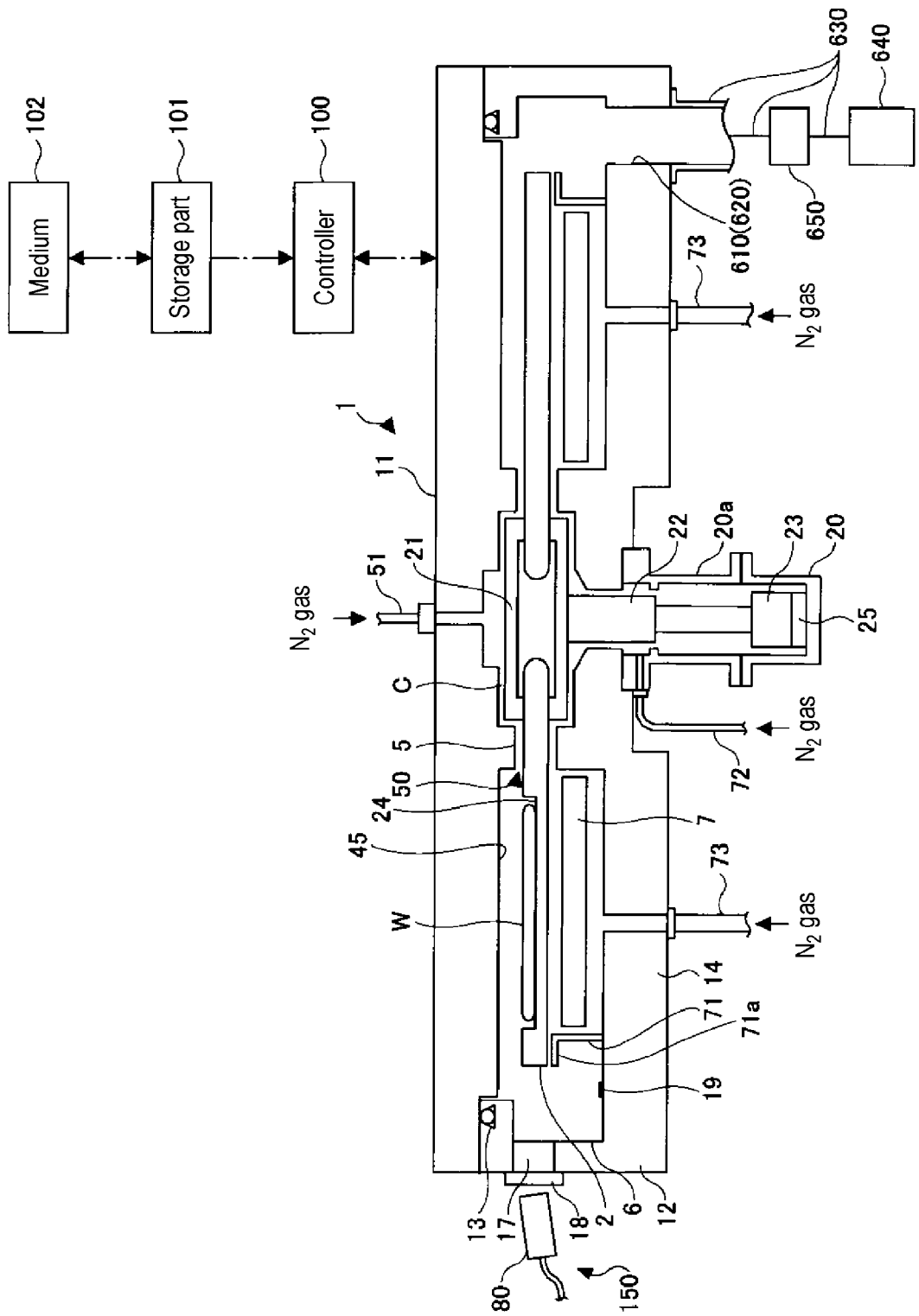
FIG. 1 is a cross-sectional view illustrating an example of a substrate processing apparatus including a substrate warpage detection device according to an embodiment of the present disclosure.

FIG. 1 is a cross-sectional view illustrating an example of a substrate processing apparatus including a substrate warpage detection device according to an embodiment of the present disclosure. In FIG. 1, a substrate warpage detection device 150 according to the present embodiment includes a light transmitting part 80, a light receiving part (not shown), and a controller 100. In addition to the substrate warpage detection device 150, the substrate processing apparatus according to the present embodiment further includes a chamber 1, a rotary table 2, a window 18, a rotary shaft 22, a recess 24, and an encoder 25 as major components. In addition, the substrate processing apparatus may include, as necessary, various components in the chamber 1 and various components attached to the chamber 1 necessary for substrate processing. Further, in FIG. 1, a wafer W as a detection target of warpage is illustrated.

As illustrated in FIG. 1, the substrate processing apparatus according to the present embodiment has a substantially circular planar shape, and includes a flat chamber 1 and a rotary table 2 provided in the chamber 1 and having a rotation center at the center of the chamber 1.

The chamber 1 is a process container for processing a substrate such as the wafer W or the like. All chambers for substrate processing in which the substrate processing is performed using the rotary table 2 may be used as a chamber 1 to which the substrate warpage detection device 150 according to the present embodiment can be applied, regardless of the substrate processing contents in the chamber 1. Therefore, the substrate processing apparatus may be configured as an apparatus for performing various substrate processing. However, in a first embodiment, for ease of description, an example in which the chamber 1 is configured as a film forming chamber for performing a film forming process will be described. Further, in the case where the film forming process is performed using the chamber 1, it is normal to supply a reaction gas for film formation into the chamber 1 in a state where an interior of the chamber 1 is set at a high temperature. In the substrate processing apparatus according to the present embodiment, an example in which a film forming process using an atomic layer deposition method for forming an atomic layer on the surface of the wafer W or a molecular layer deposition method for forming a molecular layer thereon is performed will be described.

The chamber 1 is configured as an airtight container for processing the wafer W. As illustrated in FIG. 1, the chamber 1 is configured by a ceiling plate 11 and a container body 12, and may form the airtight container as a whole. The ceiling plate 11 is pressed against a side of the container body 12 via a sealing member, for example, an O-ring 13, according to its internal depressurization state so that the chamber 1 is airtightly sealed.

Further, in the substrate processing apparatus according to the present embodiment, a hole 17 is formed in a portion of the sidewall of the container body 12. In addition, a window 18 is formed so as to close the hole 17. It is also configured such that the light transmitting part 80 is installed outside the window 18 to irradiate a laser beam from the outside of the chamber 1 toward the wafer W on the rotary table 2 via the window 18.

The chamber 1 has an exhaust port 610 connected to a vacuum pump 640, and may also be configured as a vacuum container that can be vacuum-exhausted.

The rotary table 2 is a substrate loading table for loading the substrate, and is installed in the chamber 1. The recess 24 having substantially the same size as that of the wafer W and having a concave shape is formed as a substrate loading region on the surface of the rotary table 2 and is configured such that the wafer W is loaded at a predetermined position. Further, the rotary table 2 has a circular disc shape, and is configured such that a plurality of wafers W can be loaded along a circumferential direction. The rotary table 2 is connected to the rotary shaft 22 so as to be rotated. The rotary table 2 may also be referred to as a susceptor 2.

The rotary table 2 is fixed to a cylindrical core portion 21 at the center portion, and the core portion 21 is fixed to an upper end of the rotary shaft 22 extending in a vertical direction. The rotary shaft 22, which penetrates a bottom portion 14 of the container body 12, is installed in a driving part 23 whose lower end rotates the rotary shaft 22 around the vertical axis, in this example, in a clockwise direction. The rotary shaft 22 and the driving part 23 are accommodated in a cylindrical case body 20 having an opened upper surface. This case body 20 is airtightly installed on a lower surface of the bottom portion 14 of the chamber 1 via a flange portion 20a installed on the upper surface of the case body 20, whereby the internal atmosphere of the case body 20 is isolated from the external atmosphere.

In addition, the encoder 25 is installed in the driving part 23 so as to detect a rotation angle of the rotary shaft 22. In the substrate warpage detection device according to the present embodiment, in order to monitor a warpage state of each wafer W loaded in each recess 24 on the rotary table 2, the encoder 25 is used as means for specifying the correspondence between the recess 24 and the wafer and their positions.

The light transmitting part 80 is a light transmitting means for transmitting a laser beam from the side of the rotary table 2 toward the periphery of the surface of the rotary table 2. As will be described in detail later, the laser beam emitted from the light transmitting part 80 is emitted slightly upward in the horizontal direction, i.e., slightly obliquely upward, such that the lower portion of the laser beam collides with the upper end of the side surface of the rotary table 2 and the upper portion of the laser beam passes a portion near the surface of the rotary table 2. Therefore, it is configured such that warpage of the wafer W is detected only when the wafer W is warped and protrudes upward from the surface of the rotary table 2.

In the present embodiment, there has been described an example in which the laser beam is used as a light beam transmitted from the light transmitting part 80. However, various light sources may also be used as the light transmitting part 80 as long as they can transmit light in a beam shape. For example, LED light may be transmitted as a light beam, or lamp light may be transmitted as a light beam. In this manner, various light transmitting devices may be used as the substrate warpage detection device according to the present embodiment as long as they can transmit a light beam. However, in the following embodiments, an example in which a laser beam is used as a light beam transmitted from the light transmitting part 80 will be described for ease of description.

Therefore, the hole 17 and the window 18 are installed near the surface of the rotary table 2 at such a height that a laser beam can be transmitted from the external light transmitting part 80. Specifically, the hole 17 has the same height as the surface of the rotary table 2 of the container body 12, and is formed with some margin in the vertical direction and the horizontal direction. Further, the window 18 is installed in the hole 17 to airtightly seal the interior of the chamber 1, and at the same time the light transmitting part 80 is installed outside the chamber 1 such that a laser beam is transmitted from the laser light transmitting part 80 installed at a position slightly lower than the surface of the rotary table 2 toward the portion near the surface of the rotary table 2, and when the wafer W protrudes from the recess 24 by a predetermined height, the laser beam is shielded.

The hole 17 may also be formed by cutting out a portion of the sidewall of the container body 2.

Further, the window 18 may be made of various kinds of materials that transmit light, and may be configured as a quartz window 18 made of, for example, quartz glass. The window 18 may be installed so as to cover the hole 17 from the outside of the container body 2 or may be installed by forming a groove at any position of the hole 17 in the thickness direction and fitting it into the groove. The window 18 may be installed in various shapes as long as they can be viewed from the outside while maintaining the airtightness of the chamber 1.

The controller 100 is a control means for controlling the entire film forming apparatus and may be configured as an operation processing means configured as a computer. Upon receiving a signal indicating that the amount of received light is zero from the light receiving part (not shown), the controller 100 controls to decelerate or stop the rotation of the rotary table 2. Therefore, when the amount of warpage of the wafer W on the recess 24 increases and hence there is a possibility of detachment, it is possible to prevent the interior of the chamber 1 from being damaged by the wafer W, or another wafer W from being damaged by the wafer W in advance by decelerating or stopping the rotation of the rotary table 2.

Further, when detachment of the wafer W from the recess 24 is detected, the controller 100 controls to stop the rotary table 2. This is because, when detachment occurs, it is necessary to quickly stop the rotation of the rotary table 2 as soon as possible to prevent the interior of the chamber 1 from being damaged.

A program that causes the film forming apparatus to execute a predetermined film forming method including deceleration or stopping the rotation of the rotary table 2 based on an alarm signal from the substrate warpage detection device 150 under the control of the controller 100 is stored in a memory of the controller 100. This program has a group of steps organized to execute the predetermined film forming method including the deceleration process and the stop process of the rotation of the rotary table 2, and is stored in a medium 102 such as a hard disk, a compact disc, a magneto-optical disc, a memory card, a flexible disk or the like. The program is read from a storage part 101 by a predetermined reading device and is installed in the controller 100.

Next, a configuration of the substrate warpage detection device 150 and the substrate processing apparatus (film forming apparatus) will be described in more detail with reference to FIGS. 2 to 5.

Figure 2:
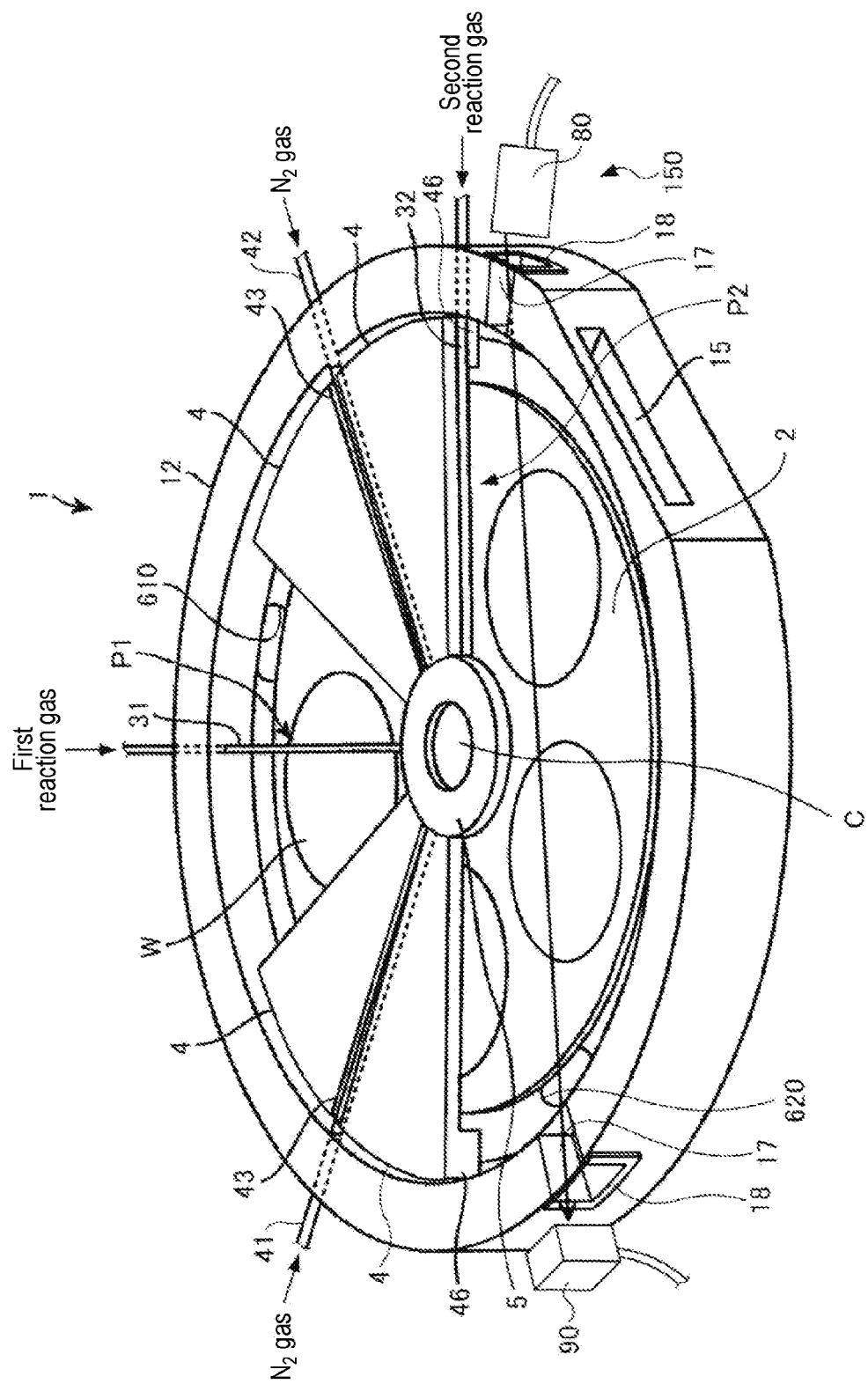
FIG. 2 is a perspective view of the substrate warpage detection device and the substrate processing apparatus according to an embodiment of the present disclosure.
Figure 3:
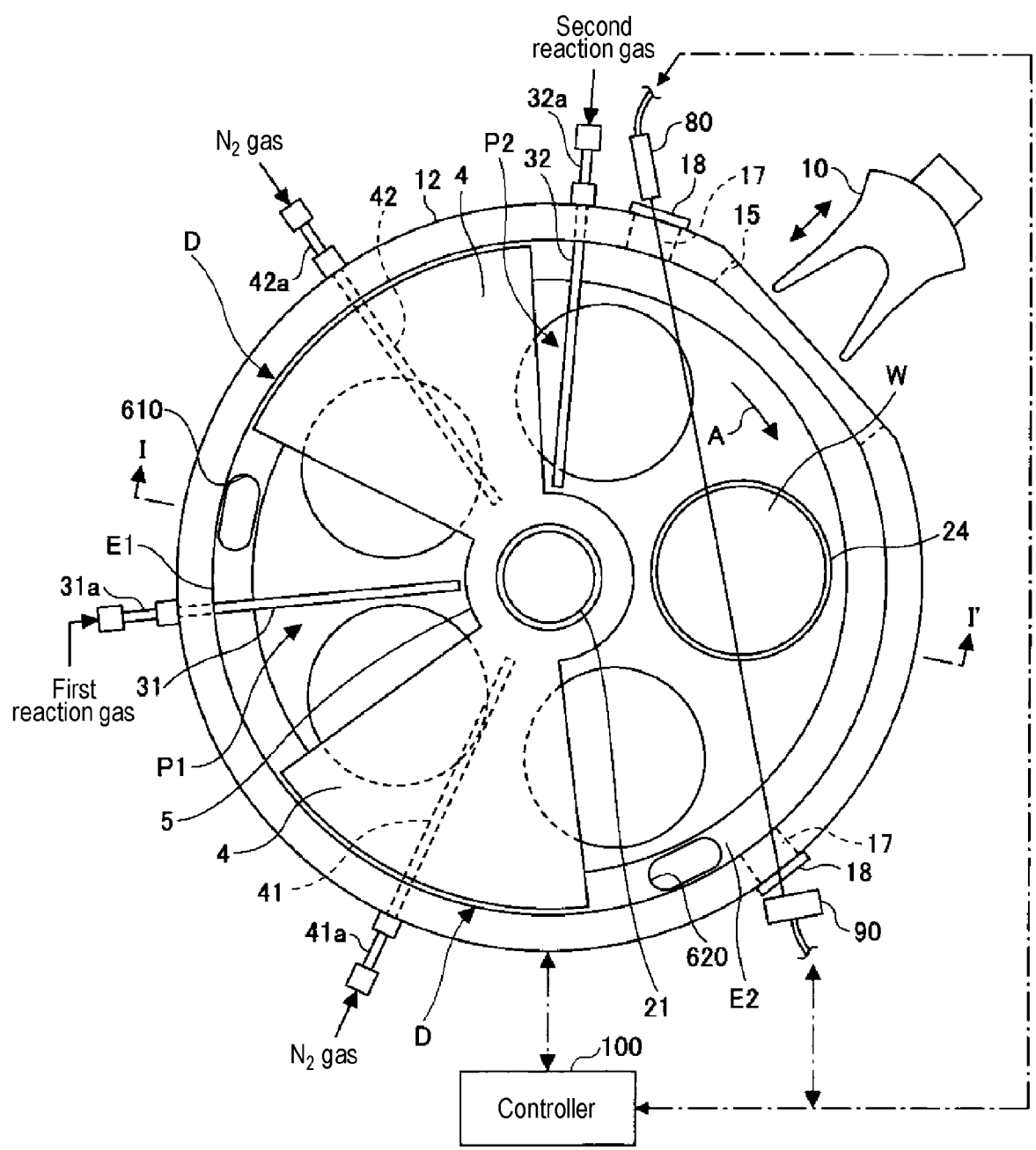
FIG. 3 is a schematic plan view illustrating an internal configuration of a chamber of the substrate warpage detection device and the substrate processing apparatus according to an embodiment of the present disclosure.

FIG. 2 is a perspective view of the substrate warpage detection device and the substrate processing apparatus according to an embodiment of the present disclosure. FIG. 3 is a schematic plan view illustrating an internal configuration of the chamber of the substrate warpage detection device and the substrate processing apparatus according to an embodiment of the present disclosure. In FIG. 2 and FIG. 3, illustration of the ceiling plate 11 is omitted for convenience of description.

As illustrated in FIGS. 2 and 3, circular recesses 24 for loading a plurality of semiconductor wafers W (five wafers in the illustrated example) as substrates along the rotational direction (circumferential direction) are formed on the surface of the rotary table 2. In FIG. 3, for the sake of convenience, the wafer W is illustrated only in one recess 24. This recess 24 has an inner diameter slightly (for example, 4 mm) larger than the diameter of the wafer W, and a depth substantially equal to the thickness of the wafer W or greater than the thickness of the wafer W. Therefore, when the wafer W is accommodated in the recess 24, the surface of the wafer W and the surface of the rotary table 2 (a region where the wafer W is not loaded) are at the same height, or the surface of the wafer W becomes lower than the surface of the rotary table 2. Even when the depth of the recess 24 is greater than the thickness of the wafer W, it is desirable to set the depth up to about three times the thickness of the wafer W since the film formation may be affected if the depth is made too great. Conversely, the height of the wafer W may be higher than the surface of the rotary table 2. There is a possibility of detachment if the height of the wafer W largely protrudes from the surface of the rotary table 2. However, even when the surface of the wafer W is higher than the surface of the rotary table 2, as long as the portion of the wafer W lower than the surface of the rotary table 2 is reliably accommodated in the recess 24, the wafer W can be kept in place. Therefore, the height of the surface of the wafer W may be higher than the surface of the rotary table 2 as long as the wafer W is not detached from the recess 24 while the rotary table 2 rotates. Through holes (not shown) through which, for example, three elevating pins for raising and lowering the wafer W with the rear surface of the wafer W supported penetrate are formed on the bottom surface of the recess 24.

As illustrated in FIGS. 2 and 3, the light transmitting part 80 and the light receiving part 90 are installed to face each other such that the laser beam can pass regions above two wafers W. The light receiving part 90 is a light receiving means for receiving the laser beam transmitted from the light transmitting part 80 to detect the amount of received light. As described above, since the laser beam passes the portion near the surface of the rotary table 2, when the wafer W does not protrude upward from the surface of the rotary table 2, the laser beam enters the light receiving part 90 and the light receiving part 90 detects the amount of received light of the laser beam. On the other hand, when the wafer W protrudes from the surface of the rotary table 2 by a predetermined height and shields the laser beam, the laser beam does not enter the light receiving part 90 and thus the light receiving part 90 does not detect the amount of received light of the laser beam. Thus, it is possible to detect protrusion, i.e., warpage of the wafer W at the predetermined height or more.

The hole 17 is also formed on the wall surface of the container body 12 on the light receiving part side so that the light receiving part 90 can receive the laser beam, and is covered with the window 18. This makes it possible to receive the laser beam transmitted from the light transmitting part 80. Details of the configuration of the light transmitting part 80 and the light receiving part 90 of the substrate warpage detection device 150 will be described hereinbelow.

Next, other components of the substrate processing apparatus will be described.

As illustrated in FIGS. 2 and 3, a reaction gas nozzle 31, a reaction gas nozzle 32, and isolation gas nozzles 41 and 42, each of which is made of, for example, quartz, are disposed above the rotary table 2 at intervals in the circumferential direction of the chamber 1 (the rotational direction of the rotary table 2) (the arrow A in FIG. 3)). In the illustrated example, the isolation gas nozzle 41, the reaction gas nozzle 31, the isolation gas nozzle 42, and the reaction gas nozzle 32 are sequentially arranged in the clockwise direction (the rotational direction of the rotary table 2) from a transfer port 15 which will be described later. These nozzles 31, 32, 41, and 42 are introduced into the chamber 1 from the outer peripheral wall of the chamber 1 by fixing gas introduction ports 31a, 32a, 41a, and 42a (FIG. 3) which are base end portions of the respective nozzles 31, 32, 41, and 42 to the outer peripheral wall of the container body 12 and are installed so as to extend horizontally with respect to the rotary table 2 along the radial direction of the container body 12.

The reaction gas nozzle 31 is connected to a supply source (not shown) of a first reaction gas via a pipe, a flow rate controller, and the like (not shown). The reaction gas nozzle 32 is connected to a supply source (not shown) of a second reaction gas via a pipe, a flow rate controller, and the like (not shown). Both of the isolation gas nozzles 41 and 42 are connected to a supply source (not shown) of, for example, a nitrogen ($N_2$) gas as an isolation gas via a pipe, a flow rate control valve, and the like (not shown). Further, when plasma is used, argon (Ar) is often used as the isolation gas. As described above, as the isolation gas, it may be possible to use an inert gas or a rare gas that is suitable depending on the application.

A plurality of gas discharge holes 33 that are opened toward the rotary table 2 are arranged in the reaction gas nozzles 31 and 32 at intervals of, for example, 10 mm, along the longitudinal direction of the reaction gas nozzles 31 and 32. The lower region below the reaction gas nozzle 31 becomes a first processing region P1 for adsorbing the first reaction gas onto the wafer W. The lower region below the reaction gas nozzle 32 becomes a second processing region P2 where the first reaction gas adsorbed onto the wafer W in the first processing region P1 and the second reaction gas react with each other.

Referring to FIGS. 2 and 3, two convex portions 4 are provided in the chamber 1. In order to form an isolation region D together with the isolation gas nozzles 41 and 42, the convex portions 4 are formed on the rear surface of the ceiling plate 11 so as to protrude toward the rotary table 2 as described hereinbelow. In addition, the convex portion 4 has a fan-like planar shape whose top portion is cut in an arc shape, and in the present embodiment, the inner circular arc is connected to a protrusion 5 (which will be described later), the outer circular arc is arranged along the inner peripheral surface of the container body 12.

Figure 4:
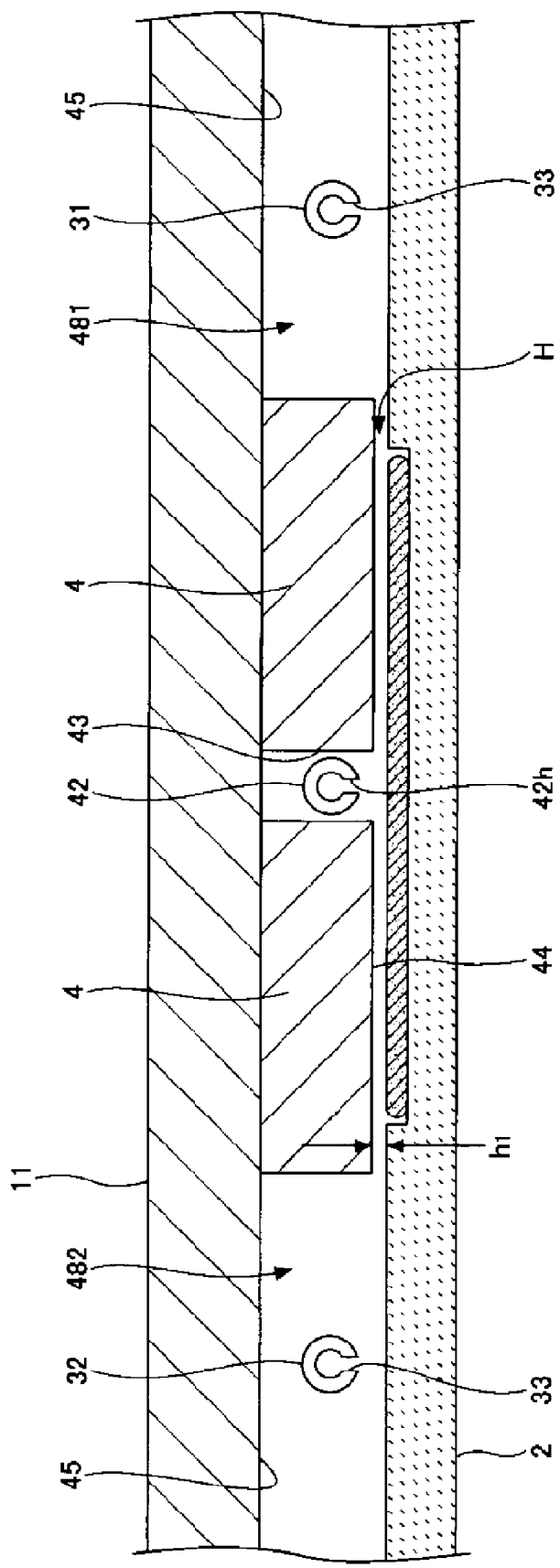
FIG. 4 is a view illustrating a cross section of the chamber along a concentric circle of a rotary table.

FIG. 4 illustrates a cross section of the chamber 1 along the concentric circle of the rotary table 2 from the reaction gas nozzle 31 to the reaction gas nozzle 32. As illustrated in the drawing, since the convex portions 4 are formed on the rear surface of the ceiling plate 11, a flat low ceiling surface 44 (first ceiling surface) which is the lower surface of each of the convex portions 4 and a ceiling surface 45 (second ceiling surface) which is higher than the ceiling surface 44 and located on both sides of the ceiling surface 44 in the circumferential direction exist in the chamber 1. The ceiling surface 44 has a fan-like planar shape whose top portion is cut in an arc shape. In addition, as illustrated in the drawing, a concave portion 43 formed so as to extend in the radial direction is formed at the center of the convex portion 4 in the circumferential direction, and the isolation gas nozzle 42 is accommodated in the concave portion 43. Similarly, the concave portion 43 is also formed in the other convex portion 4, and the isolation gas nozzle 41 is accommodated therein. Further, the reaction gas nozzles 31 and 32 are respectively installed in a space below the high ceiling surface 45. These reaction gas nozzles 31 and 32 are installed near the wafer W apart from the ceiling surface 45. For convenience of description, as illustrated in FIG. 4, a space below the high ceiling surface 45 where the reaction gas nozzle 31 is installed is denoted by reference numeral 481, and a space below the high ceiling surface 45 where the reaction gas nozzle 32 is installed is denoted by reference numeral 482.

In addition, a plurality of gas discharge holes 42h (see FIG. 4) that are opened toward the rotary table 2 are arranged in the isolation gas nozzles 41 and 42 accommodated in the concave portion 43 of the convex portion 4 at intervals of, for example, 10 mm, along the longitudinal direction of the isolation gas nozzles 41 and 42.

The ceiling surface 44 forms an isolation space H which is a narrow space with respect to the rotary table 2. When an $N_2$ gas is supplied from the discharge hole 42h of the isolation gas nozzle 42, this $N_2$ gas flows toward the space 481 and the space 482 via the isolation space H. At this time, since the volume of the isolation space H is smaller than the volume of the spaces 481 and 482, the pressure of the isolation space H can be higher than the pressure of the spaces 481 and 482 by the $N_2$ gas. That is, the isolation space H having a high pressure is formed between the spaces 481 and 482. Further, the $N_2$ gas flowing out from the isolation space H into the spaces 481 and 482 acts as a counter flow against the first reaction gas from the first region P1 and the second reaction gas from the second region P2. Therefore, the first reaction gas from the first region P1 and the second reaction gas from the second region P2 are isolated by the isolation space H. Accordingly, the first reaction gas and the second reaction gas are prevented from being mixed and reacting with each other in the chamber 1.

Further, it is desirable that a height h1 of the ceiling surface 44 with respect to the upper surface of the rotary table 2 be set at a height suitable for making sure that the pressure of the isolation space H is higher than the pressure of the spaces 481 and 482 in consideration of the internal pressure of the chamber 1, the rotation speed of the rotary table 2, the supply amount of an isolation gas (N₂ gas) to be supplied, or the like during the film formation.

On the other hand, the protrusion 5 (FIGS. 2 and 3) surrounding the outer periphery of the core portion 21 for fixing the rotary table 2 is formed on the lower surface of the ceiling plate 11. In the present embodiment, this protrusion 5 is continuous with a portion on the rotation center side of the convex portion 4, and the lower surface thereof is formed at the same height as that of the ceiling surface 44.

Figure 5:
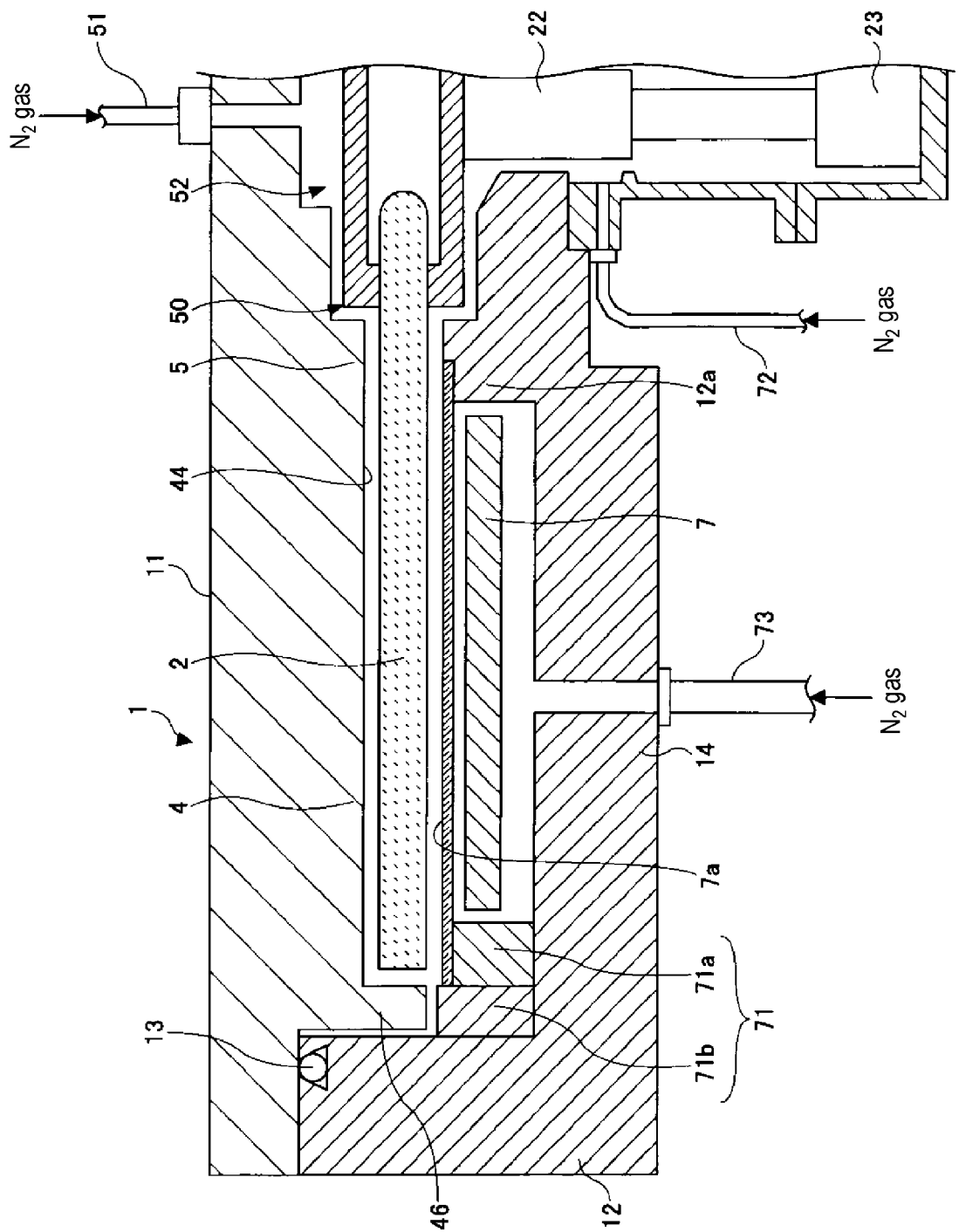
FIG. 5 is a cross-sectional view illustrating a region where a ceiling surface is installed.

FIG. 1 referred to above is a cross-sectional view taken along line I-I' in FIG. 3 and illustrates a region where the ceiling surface 45 is formed. On the other hand, FIG. 5 illustrates a cross-sectional view of a region where the ceiling surface 44 is formed. As illustrated in FIG. 5, a bent portion 46 bent in an L shape so as to face the outer end surface of the rotary table 2 is formed in the peripheral portion of the fan-like convex portion 4 (the portion at the outer edge side of the chamber 1). Similar to the convex portion 4, this bent portion 46 suppresses the reaction gases from trespassing into both sides of the isolation region D and suppresses mixing of both reaction gases. Since the fan-like convex portion 4 is formed on the ceiling plate 11 and the ceiling plate 11 is configured to be removable from the container body 12, a slight gap exists between the outer peripheral surface of the bent portion 46 and the container body 12. The gap between the inner peripheral surface of the bent portion 46 and the outer end surface of the rotary table 2 and the gap between the outer peripheral surface of the bent portion 46 and the container body 12 are set to, for example, a dimension equal to the height of the ceiling surface 44 with respect to the upper surface of the rotary table 2.

In the isolation region D, the inner peripheral wall of the container body 12 is formed as a vertical surface close to the outer peripheral surface of the bent portion 46 as illustrated in FIG. 4, but in a portion other than the isolation region D, it is recessed outward over a region ranging from a portion facing the outer end surface of the rotary table 2 to the bottom portion 14. Hereinafter, for convenience of description, the recessed portion having a substantially rectangular cross-sectional shape is referred to as an exhaust region. Specifically, an exhaust region communicating with the first process region P1 is referred to as a first exhaust region E1, and an exhaust region communicating with the second process region P2 is referred to as a second exhaust region E2. As illustrated in FIGS. 1 to 3, a first exhaust port 610 and a second exhaust port 620 are formed in the bottom portions of the first exhaust region E1 and the second exhaust region E2, respectively. As illustrated in FIG. 1, the first exhaust port 610 and the second exhaust port 620 are respectively connected to, for example, a vacuum pump 640, which is a vacuum exhaust means, via an exhaust pipe 630. Further, in FIG. 1, reference numeral 650 denotes a pressure controller.

As illustrated in FIGS. 1 and 5, a heater unit 7 as a heating means is installed in the space between the rotary table 2 and the bottom portion 14 of the chamber 1 such that the wafer W on the rotary table 2 is heated to a temperature (for example, 450 degrees C.) specified in a process recipe via the rotary table 2. A ring-shaped cover member 71 is installed on the lower side near the periphery of the rotary table 2 in order to suppress a gas from flowing to the lower region of the rotary table 2 by separating the atmosphere from the upper space of the rotary table 2 to the exhaust regions E1 and E2 from the atmosphere where the heater unit 7 is placed (FIG. 5). This cover member 71 has an inner member 71a which is formed such that it faces the outer edge portion of the rotary table 2 and a portion positioned more outward than the outer edge portion of the rotary table 2 from the lower side, and an outer member 71b installed between the inner member 71a and the inner wall surface of the chamber 1. The outer member 71b is installed close to the bent portion 46 and below the bent portion 46 that is formed in the outer edge portion of the convex portion 4 in the isolation region D, and the inner member 71a is installed below the outer edge portion of the rotary table 2 (and below a portion slightly outside the outer edge portion) so as to surround the heater unit 7 over the entire circumference.

The bottom portion 14 at a portion closer to the rotation center than the space where the heater unit 7 is disposed protrudes upward so as to approach the core portion 21 near the center portion of the lower surface of the rotary table 2 to form a protrusion 12a. A narrow space is formed between the protrusion 12a and the core portion 21. A narrow gap is formed between an inner peripheral surface of a through hole of the bottom portion 14 through which the rotary shaft 22 penetrates and the rotary shaft 22, and these narrow spaces communicate with the case body 20. Further, a purge gas supply pipe 72 for supplying an N₂ gas, which is a purge gas, into the narrow spaces is installed in the case body 20. In addition, a plurality of purge gas supply pipes 73 for purging the arrangement space of the heater unit 7 are installed in the bottom portion 14 of the chamber 1 at predetermined angular intervals in the circumferential direction below the heater unit 7 (only one purge gas supply pipe 73 is illustrated in FIG. 5). Further, in order to suppress a gas from flowing into the region where the heater unit 7 is installed, a lid member 7a that covers between the inner peripheral wall of the outer member 71b (the upper surface of the inner member 71a) and the upper end portion of the protrusion 12a along the circumferential direction is installed between the heater unit 7 and the rotary table 2. The lid member 7a may be made of, for example, quartz.

In addition, an isolation gas supply pipe 51 is connected to the center portion of the ceiling plate 11 of the chamber 1 and it is configured to supply an N₂ gas as an isolation gas to a space 52 between the ceiling plate 11 and the core portion 21. The isolation gas supplied to the space 52 is discharged toward the periphery of the rotary table 2 along the surface of the rotary table 2 on the recess 24 side via a narrow space 50 between the protrusion 5 and the rotary table 2. The space 50 can be maintained at a pressure higher than that of the space 481 and the space 482 by the isolation gas. Therefore, the first reaction gas supplied to the first processing region P1 and the second reaction gas supplied to the second processing region P2 are suppressed by the space 50 from being mixed through the central region C. That is, the space 50 (or the central region C) can function like the isolation space H (or the isolation region D).

Further, as illustrated in FIGS. 2 and 3, the transfer port 15 for transferring the wafer W as the substrate is formed on the sidewall of the chamber 1 between the external transfer arm 10 and the rotary table 2. This transfer port 15 is opened and closed by a gate valve (not shown). Since the wafer W is transferred to and from the transfer arm 10 at a transfer position where the recess 24, which is the wafer loading region of the rotary table 2, faces the transfer port 15, an elevating pin for transfer which penetrates the recess 24 and lifts the wafer W from the rear surface and an elevating mechanism (none of them are shown) are installed at a position corresponding to the transfer position on the lower side of the rotary table 2.

Next, the substrate warpage detection device 150 according to the present embodiment will be described in more detail.

Figure 6A:
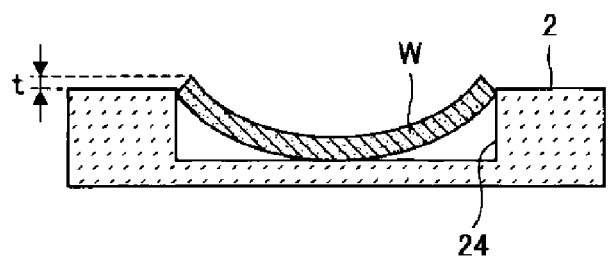
FIGS. 6A and 6B are views illustrating a basic principle of the substrate warpage detection device according to the present embodiment.
Figure 6B:
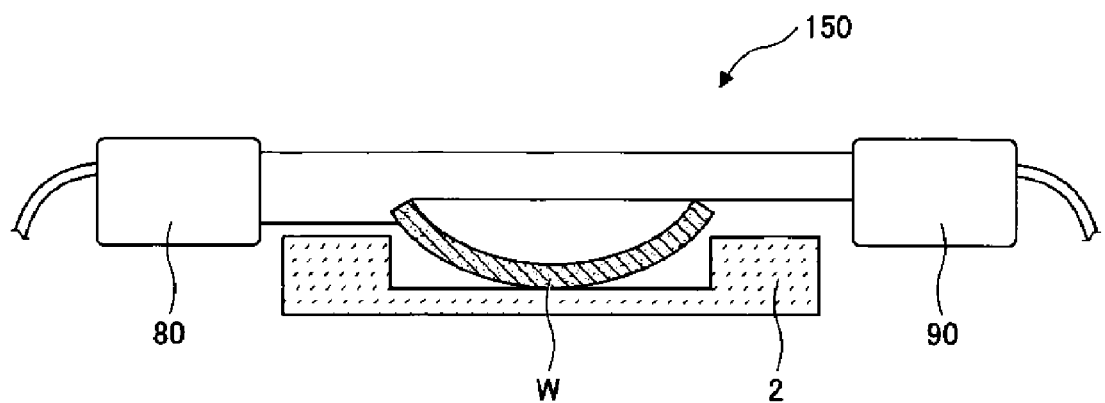

FIGS. 6A and 6B are views illustrating a basic principle of the substrate warpage detection device according to the present embodiment. FIG. 6A is a view illustrating a state in which the wafer W loaded in the recess 24 of the rotary table 2 is warped. As illustrated in FIG. 6A, when a warpage occurs in the wafer W in the recess 24, both ends of the wafer W protrude upward and protrude from the surface of the rotary table 2 by a predetermined height t. Here, when the predetermined height t becomes too large, the wafer W deviates from the recess 24, and other wafers W and the interior of the chamber 1, as well as the deviated wafer W, may be damaged. Therefore, it is necessary to detect warpage of the wafer W at a stage where the wafer W has not deviated from the recess 24 yet and remains in the recess 24 by using the predetermined height t. Such a predetermined height t is a very small value such as 0.8 mm or less, preferably, 0.4 mm or less although it depends on the rotation speed of the rotary table 2 or other conditions. Therefore, it is required to detect a protrusion at the stage where the warped wafer W slightly protrudes from the rotary table 2, such as 0.4 mm or less.

Further, FIG. 6A illustrates an example in which both ends of the wafer W are warped upward and protrude upward, but the shapes of warpage of the wafer W are various, such as a reverse warped shape in which the center portion is more warped upward than the peripheral portion as described herein below or any shape which is irregularly warped upward without special regularity like potato chips. The substrate warpage detection device 150 according to the present embodiment can detect the warpage of the wafer W irrespective of the shape of warpage of the wafer W.

FIG. 6B is a view illustrating a basic principle of warpage detection of the substrate warpage detection device 150 according to the present embodiment. As illustrated in FIG. 6B, a laser beam is transmitted from the light transmitting part 80 to the portion near the surface of the rotary table 2, and is received by the opposing light receiving part 90. However, when warpage occurs in the wafer W and the wafer W protrudes from the rotary table 2, the amount of received light of the laser beam is limited and reduced depending on the amount of protrusion. This is the basic principle of the detection of the warpage of the wafer.

However, it is actually quite difficult to transmit the laser beam near the surface of the rotary table 2 in parallel with the surface of the rotary table 2. In general, the rotary table 2 is formed of quartz, but in many cases, the surface of the rotary table 2 may not be a perfect horizontal plane due to limitations in processing precision and installation precision. That is, when the rotary table 2 rotates, the surface of the rotary table 2 slightly moves vertically. The vertical movement may be caused by delicate inclination of the rotary table 2, or may be caused by unevenness slightly existing on the surface, but in any case, the surface slightly moves vertically.

In the case where the laser beam is horizontally irradiated from the side of the rotary table 2, the laser beam may collide with the surface of the rotary table 2 due to the vertical movement of the rotary table 2 and thus be reflected upward or downward, or may pass as it is without collision. Although a laser beam is received by the light receiving part 90 through such large variations, there may be a case in which noise of reflected light may be large or completely blocked. Thus, it is very difficult to detect the presence or absence of protrusion of the wafer W.

Therefore, in the substrate warpage detection device according to the present embodiment, a configuration that prevents such a reflected light is adopted.

FIG. 7 is a view illustrating an example of the substrate warpage detection device 150 according to the present embodiment. As illustrated in FIG. 7, the light transmitting part 80 and the light receiving part 90 are disposed to face each other. The light transmitting part 80 is disposed such that the optical axis slightly faces upward so that the laser beam L is transmitted obliquely upward. The laser beam L is arranged such that the lower end portion of the laser beam collides with the upper end of the side surface of the rotary table 2, a portion of the laser beam is blocked by the side surface of the rotary table 2, it is limited only to the upward reflection, and the remaining upper portion passes the portion near the surface of the rotary table 2. If the vertical width of the beam L is too small, it is difficult to adopt a configuration in which the lower portion is shielded and the upper portion passes. Accordingly, a laser beam L having a sufficient upper and lower width such that, even if a portion of the laser beam is shielded, the remaining portion sufficiently functions as a laser is transmitted. The upper limit of the beam width of the laser beam L is not particularly limited, but the lower limit thereof has such a size that the remaining portion functions as a laser even if it is partially shielded as described above. Also, the vertical width of the laser beam L may be, for example, about 0.7 to 2 mm, preferably, about 0.8 to 1.2 mm.

By transmitting the laser beam L obliquely upward in this way, it is possible to limit the reflected light, which is reflected by the surface of the wafer W and enters the light receiving part 90 in one direction so as to make it very small. Since the laser beam L is emitted upward, no obstacle exists until reaching the light receiving part 90, except that the lower end portion of the laser beam L collides with the upper end portion of the side surface of the rotary table 2. In this case, although the ratio of the portion of the laser beam L passing the portion near the surface of the rotary table 2 without colliding to the portion blocked due to the collision with the upper end of the side surface of the rotary table 2 is changed, the basic configuration that the portion of the lower portion of the laser beam L is shielded but the upper portion thereof passes the portion near the surface of the rotary table 2 does not change even when the rotary table slightly moves vertically. Therefore, even when the rotary table 2 vertically moves, it becomes possible to stably receive the laser beam L by the light receiving part 90 without being affected by the reflected light.

Further, a lifter 26 is illustrated in FIG. 7 since a warpage detection experiment was conducted by using a lifter 26 so as to lift the wafer W. However, when it is actually applied to the rotary table 2, the wafer W is not lifted by the lifter 26 but protrudes from the recess 24 due to warpage of the wafer W. Therefore, the lifter 26 is not a particularly necessary component in the substrate warpage detection device 150 and the substrate processing apparatus according to the present embodiment.

For example, when the laser beam L passes the rotary table 2, a distance d between the laser beam L and the surface of the rotary table 2 may be set to a range of 0.1 to 1.0 mm. The laser beam L may also be provided to have an angle of, for example, 0.1 to 15 degrees, preferably, 0.1 to 10 degrees, more preferably, 0.1 to 5 degrees with respect to the horizontal plane. By fixedly installing the light transmitting part 80 so as to slightly orient upward in this manner, even when the surface of the rotary table 2 slightly moves vertically during rotation, it is possible to detect the warpage of the wafer W without being affected by the reflected light.

As the light receiving part 90, various light receiving means may be used as long as they can detect the amount of received light of the laser beam L. For example, a charge coupled device (CCD) may be used as a light receiving element. For example, by setting the detection amount of light received by the light receiving part 90 to be zero when the wafer W protrudes by the predetermined height t, it can be detected that when the light receiving part 90 receives the laser beam L, warpage of the wafer W is less than the predetermined height t, and that when the light receiving part 90 does not receive the laser beam L, the wafer W protrudes beyond the predetermined height t and warpage of a predetermined amount or more occurs.

Even when the actual detection amount of received light is not zero, a warpage occurrence can be detected by setting a detection amount of received light at which the wafer W is estimated to be in a warped state to a threshold value. That is, when a detection value of amount of received light is less than a predetermined threshold value, it may be detected that the wafer W protrudes by the predetermined height t and that warpage of the predetermined amount or more has occurred. Since it is possible to appropriately set the threshold value depending on applications, there is no need to dispose the light transmitting part 80 such that warpage occur in the wafer W only when the amount of received light is zero, and it is possible to flexibly install the light transmitting part 80 and the light receiving part 90 in consideration of installation conditions or the like.

Hereinafter, a case where a predetermined amount of received light determining that the wafer W has protruded by a predetermined height t and warped is set as the threshold value will be described. Also, the predetermined amount of received light may be zero.

Further, it is desirable that determination of such a height at which such amount of received light becomes less than the predetermined threshold value is conducted with respect to the recess 24 whose surface of the rotary table 2 is located at the lowest position. At the position of this recess 24, even when the warpage of the wafer W is large, since the position of the rotary table 2 is low, the laser beam L is not blocked by the wafer W and reaches the light receiving part 90. Thus, such position becomes a position having a largest possibility of misjudging that no warpage has occurred in the wafer W. If the amount of received light of the light receiving part 90 that is available when the wafer W protrudes by the predetermined height t at that position is set to be less than the predetermined threshold value, it is possible to reliably detect warpage of the substrate for all the recesses 24 when the height of the rotary table 2 is at a high position where there is a low possibility of such misjudgment.

If necessary, a shielding plate 110 may be disposed in front of the light receiving part 90. The shielding plate 110 can cut the reflected light of the upper portion that may enter the light receiving part 90 and prevent the detection of noise. Since the upper portion of the laser beam L entering the light receiving part 90 can be regulated by installing the shielding plate 110, it is possible to keep the vertical width of light entering the light receiving part 90 constant regardless of the vertical width of the laser beam L and to use the laser beam L having a large aperture.

In installing the shielding plate 110, the light transmitting part 80, the light receiving part 90, and the shielding plate 110 may be disposed such that the incident light of the laser beam L passing below the shielding plate 110 becomes less than a predetermined threshold value when the wafer W protrudes from the surface of the rotary table 2 by the predetermined height t.

ON/OFF setting may be made, in which, when the amount of received light is detected to be less than the predetermined threshold value, it is detected that the received light is zero and it is regarded that there was no received light. Such setting may be variously made depending on the application under the control of the controller 100 and the light receiving part 90.

Further, when it is detected that the amount of received light is less than the predetermined threshold value, it is desirable that the controller 100 decelerates or stops the rotation of the rotary table 2. The predetermined height t may be differently set depending on the application. For example, it is desirable that the predetermined height t be set to a warning level height meaning that the wafer W reaches the predetermined height t but remains without deviating from the recess 24 which means that there is a possibility of detachment if it is left as it is. Accordingly, when the protrusion amount of the wafer W reaches the predetermined height t, a measure can be taken before the wafer W is detached from the recess 24 by decelerating or stopping the rotary table 2, thereby preventing the wafer W and the chamber 1 from being damaged.

Next, an example in which such a substrate warpage detection device 150 is applied to the substrate processing apparatus to perform substrate processing will be described. Further, as described above, since the aforementioned substrate processing apparatus is configured as a film forming apparatus, an example in which film formation is performed on a substrate will be described.

First, a wafer W is carried into the chamber 1. When a substrate such as the wafer W is loaded, the gate valve (not shown) is first opened. Then, the wafer W is loaded on the rotary table 2 by the transfer arm 10 via the transfer port 15 while intermittently rotating the rotary table 2.

Subsequently, the gate valve (not shown) is closed and the wafer W is heated to a predetermined temperature by the heater unit 7 while rotating the rotary table 2 in a state in which the interior of the vacuum chamber 1 is set at a predetermined pressure by the vacuum pump 64 and a pressure regulating part 65. At this time, an isolation gas, for example, an $N_2$ gas, is supplied from the isolation gas nozzles 41 and 42.

The substrate warpage detection device 150 is operated to start detecting warpage of the wafer W while rotating the rotary table 2.

Subsequently, the first reaction gas is supplied from the first reaction gas nozzle 31, and the second reaction gas is supplied from the second reaction gas nozzle 32. In addition, although not illustrated in FIGS. 2 and 3, in the case of performing a plasma modification process, a plasma processing gas is supplied at a predetermined flow rate from a gas nozzle for plasma processing.

Here, various kinds of gases may be used as the first reaction gas and the second reaction gas depending on the application, but a raw material gas is supplied from the first reaction gas nozzle 31, and an oxidizing gas or nitriding gas is supplied from the second reaction gas nozzle 32. In the case of performing a plasma process, a plasma processing gas including an oxidizing gas or nitriding gas similar to the oxidizing gas or nitriding gas supplied from the second reaction gas nozzle and a mixture gas containing a rare gas is supplied from the gas nozzle for plasma processing (not shown).

Here, an example where a film to be formed is a silicon oxide film, the first reaction gas is an Si-containing gas, and the second reaction gas is an oxygen gas will be described.

The Si-containing gas is adsorbed onto the surface of the wafer W in the first processing region P1 by rotation of the rotary table 2, and then the Si-containing gas adsorbed onto the wafer W is oxidized in the second processing region P2 by the oxygen gas. Therefore, one or more molecular layers of the silicon oxide film, which is a thin film component, are formed as a reaction product. Further, when the wafer W passes through the isolation region D, an isolation gas such as N$_2$ is supplied to purge the wafer W. By rotating the rotary table 2, the molecular layer of the silicon oxide film is deposited on the surface of the wafer W to form the silicon oxide film. As described above, in order to perform the film forming process, it is necessary to rotate the rotary table 2. However, as described above, since the rotary table 2 is heated by the heater unit 7, a warpage occurs in the wafer W during the rotation of the rotary table 2 and when the amount of warpage increases, there is a possibility that the wafer W is detached from the recess 24.

Therefore, by using the substrate warpage detection device 150 according to the present embodiment, warpage of the wafer W is continuously detected while the substrate processing is performed by the rotation of the rotary table 2 to always monitor occurrence of warpage of the wafer W. That is, the laser beam L is transmitted obliquely upward from the light transmitting part 80 and received by the light receiving part 90. Then, when the light receiving part 90 detects that the amount of received light is zero, the light receiving part 90 sends a signal indicating that the amount of received light is zero to the controller 100. The controller 100 determines that a warpage occurs in the wafer W and that there is a possibility of detachment, and prevents detachment of the wafer W being processed from the recess 24 by decelerating or stopping the rotary table 2. By carrying out the substrate processing while performing the substrate warpage detection using the substrate warpage detection device 150 in this manner, it is possible to perform the substrate processing while reliably preventing the wafer W and the chamber 1 from being damaged.

As described above, according to the substrate warpage detection device 150, the substrate warpage detection method, the substrate processing apparatus, and the substrate processing method of the present embodiment, it is possible to detect warpage of the wafer W with high precision without being affected by the reflected light during the rotation of the rotary table, to take necessary measures before the occurrence of detachment, and thus to reliably prevent the wafer W and the chamber 1 from being damaged.

Next, an embodiment in which the substrate warpage detection method is performed using the substrate warpage detection device 150 according to the present embodiment will be described.

FIG. 8 is a diagram obtained by investigating a relationship between an actual protrusion amount of the wafer W and a detection amount of received light using the substrate warpage detection device 150 according to the present embodiment when the threshold value of protrusion amount (predetermined height t) of the wafer W for warpage determination is set to 0.4 mm Since investigation was conducted for the plurality of recesses 24, plural data are indicated.

As illustrated in FIG. 8, since there are fluctuations in the height of the rotary table 2, there are also fluctuations between the recesses 24. However, when the actual protrusion amount of the wafer W is 0.4 mm, warpage of the wafer W is detected for all the recesses 24. There was no example in which it was detected that the wafer W was not warped even when it was warped. Thus it was shown that the warpage of the wafer W could be reliably detected. As described above, according to the substrate warpage detection device 150 of the present embodiment, it was shown that a strict standard of warpage detection could be met such that if 0.4 mm protrusion occurs, warpage is detected.

FIG. 9 is a diagram illustrating an example of a difference in height of the surface of the rotary table 2. As such, although the height of the surface of the rotary table 2 is different depending on the position of the recess 24, if the standard for warpage detection is set with respect to the lowest point A, the warpage of the wafer W in the recess 24 at a higher position can naturally be detected. In other words, a relation between the height of the wafer, the amount of received light by the light receiving part and the threshold value is determined with respect to the recess whose surface of the rotary table is the lowest. Further, by recognizing the difference in the height of the rotary table 2 and recognizing the position and height of the rotating recess 24 by the encoder 25, it is also possible to detect the warpage of the wafer W in consideration of such a difference in the height of the rotary table 2. This process may be performed by the controller 100. As described above, in the substrate warpage detection device 150 according to the present embodiment, it is possible to detect the warpage of the wafer W regardless of the error of the rotary table 2.

FIG. 10 illustrates results obtained by actually performing the substrate warpage detection using the substrate warpage detection device 150 according to the present embodiment, and illustrates a change with time of detection of received light by the light receiving part 90. In the graph of FIG. 10, portions surrounded by ellipses at the upper end of the vertical axis indicate light reception signals of the recess 24 in which the amount of received light that is detected is zero. Other portions where the detection values are shown lower than the above portions are the recesses 24 where a certain amount of received light is detected and a determination that no warpage occurred was made. As illustrated in FIG. 10, the portions showing that the amount of received light is zero appear periodically, and warpage is detected at a constant period only for the recess 24 in which the wafer W is warped. This period is the rotation period of the rotary table 2. Therefore, it was shown that warpage can be stably detected for the wafer W in which warpage actually occurs, and that no warpage can be stably detected for the wafer W without warpage. In this manner, the substrate warpage detection device 150 according to the present embodiment can detect the warpage of the wafer W with high reliability and stability.

Figure 11:
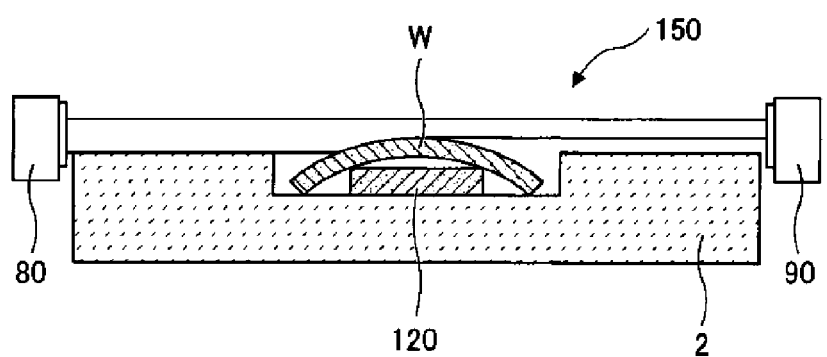
FIG. 11 is a view illustrating an example of warpage detection in a reverse warped state of a wafer.

FIG. 11 is a diagram illustrating an example of warpage detection in a reverse warped state of the wafer W. In FIGS. 6A and 6B, the warpage of a shape that both ends of the wafer W are warped upward and the center thereof is in contact with the bottom surface of the recess 24 has been illustrated. However, as illustrated in FIG. 11, there may be an aspect of warpage in which the center of the wafer W is warped upward and both ends thereof are in contact with the bottom surface of the recess 24. The aspect of warpage of the wafer W is related to the aspect of the wafer W and substrate processing, and there may be various aspects. It was also experimented whether warpage can be properly detected by the substrate warpage detection device 150 according to the present embodiment for the wafer W showing the so-called reverse warpage as illustrated in FIG. 11. Since it is difficult to intentionally make the wafer W in the reverse warped state, as illustrated in FIG. 11, the reverse warped state was reproduced by installing a chip 120 below the center portion of the wafer W.

Figure 12:
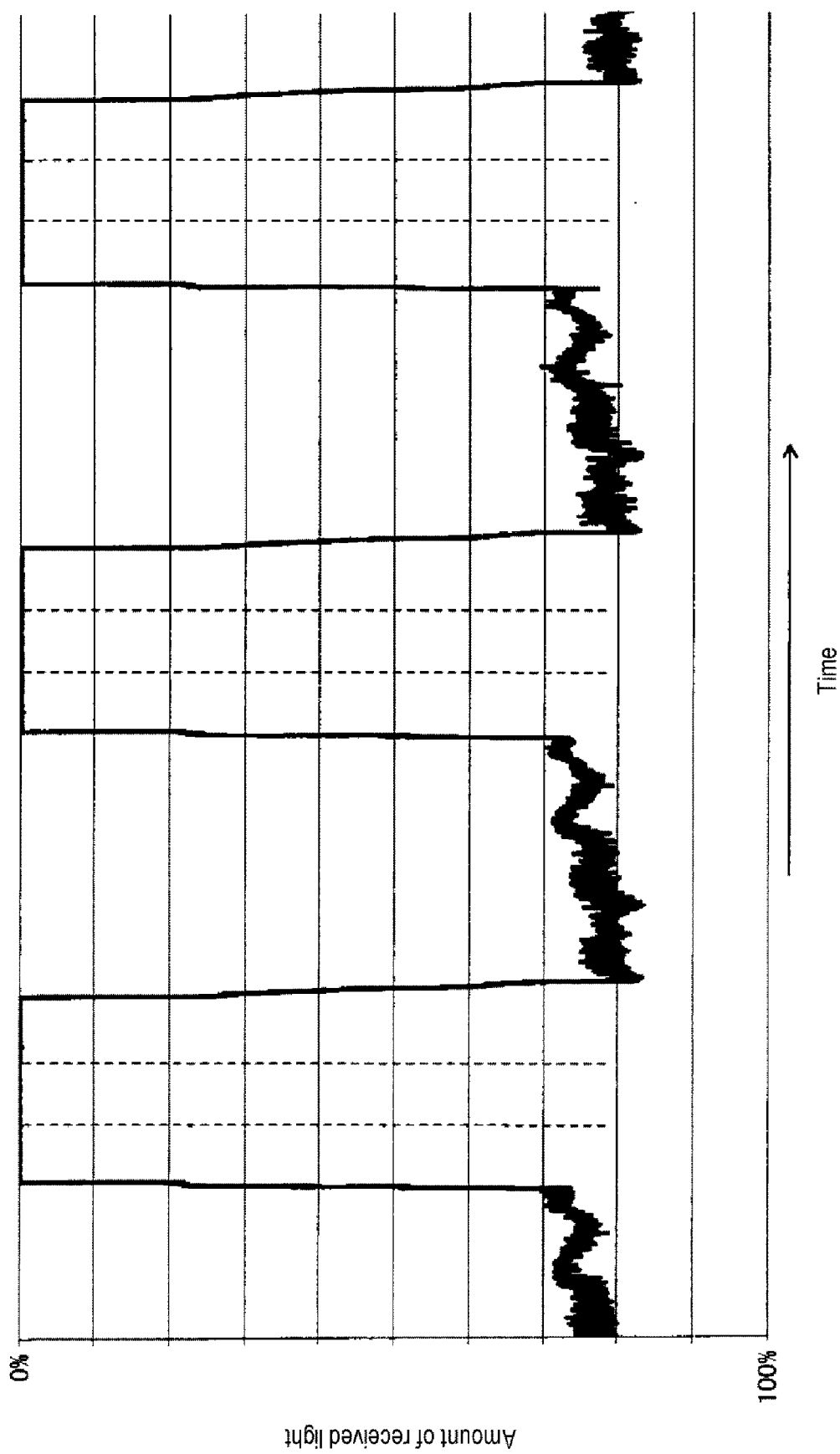
FIG. 12 is a diagram illustrating detection results of a reverse warped wafer W.

FIG. 12 is a diagram illustrating results of detecting a reverse warped wafer W. Such a reverse warped wafer W was loaded on three consecutive recesses 24, and warpage detection was conducted. By doing so, as illustrated in FIG. 12, portions having an amount of received light of zero (an amount of received light of 0%) were periodically detected in the three consecutive recesses 24. The period is one rotation of the rotary table 2 as described in FIG. 10. That is, the amount of received light of zero, namely the occurrence of warpage, was detected in three consecutive recesses 24 each time the rotary table 2 rotates.

As described above, the substrate warpage detection device 150 according to the present embodiment can also detect warpage of the reverse warped wafer W without any problem. That is, the substrate warpage detection device 150 according to the present embodiment can reliably detect warpage, irrespective of the aspect of warpage, if the wafer W protrudes from the surface of the rotary table 2 by the predetermined height t.

Further, the light transmitted from the light transmitting part 80 is not limited to the laser beam, but includes various light rays or beams as described above.

As described above, according to the substrate warpage detection device 150, the substrate warpage detection method, the substrate processing apparatus, and the substrate processing method of the present embodiment, it is possible to stably and reliably detect warpage of the wafer W during the rotation of the rotary table 2 and to reliably prevent the wafer W and the chamber 1 from being damaged.

According to the present disclosure in some embodiments, it is possible to detect warpage of a substrate before detachment of the substrate during rotation of a rotary table.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate warpage detection device for detecting warpage of a substrate loaded on a substrate loading region having a recess shape formed on a rotary table along a circumferential direction during rotation of the rotary table, the device comprising:
a light transmitter configured to transmit a light beam obliquely upward from a side of the rotary table such that a lower portion of the light beam collides with an upper end of a side surface of the rotary table and an upper portion of the light beam positioned more upward than the lower portion of the light beam passes a portion near a surface of the rotary table; and
a light receiver installed to face the light transmitter and configured to receive the light beam passing the portion near the surface of the rotary table so as to detect an amount of received light,
wherein the light transmitter is disposed such that, when the substrate loaded on the substrate loading region protrudes upward from the surface of the rotary table by a predetermined height, the amount of received light detected by the light receiver becomes less than a predetermined threshold value.

2. The device of claim 1, further comprising:
a light shielding plate installed between the substrate loading region and the light receiver and configured to shield the upper portion of the light beam entering the light receiver,
wherein the light transmitter and the light shielding plate are disposed such that, when the substrate loaded on the substrate loading region protrudes upward from the surface of the rotary table by the predetermined height, the amount of received light detected by the light receiver is less than the predetermined threshold value.

3. The device of claim 2, wherein when a height of the surface of the rotary table is locally different, a relation between the predetermined height of the substrate, the amount of received light by the light receiver and the threshold value is determined with respect to the substrate loading region whose surface of the rotary table is the lowest.

4. The device of claim 1, wherein the substrate loading region is a plurality of substrate loading regions disposed on the rotary table along the circumferential direction, and the light transmitter and the light receiver are set to pass over the plurality of substrate loading regions.

5. The device of claim 1, further comprising a controller configured to control the rotation of the rotary table,
wherein the controller is configured to decelerate or stop the rotation of the rotary table when it is detected that the amount of received light detected by the light receiver is zero.

6. The device of claim 1, wherein the predetermined height is set to a height at which the substrate is not detached from the substrate loading region and a possibility of detachment occurs when the substrate exceeds the predetermined height.

7. The device of claim 1, wherein the light transmitter is disposed such that, when the substrate loaded on the substrate loading region protrudes upward from the surface of the rotary table by the predetermined height, the amount of received light detected by the light receiver becomes zero.

8. The device of claim 1, wherein an inclined angle of the light transmitter is set to an angle of ranging from 0.1° or more to 15° or less.

9. The device of claim 1, wherein the light transmitter is disposed such that the light beam is positioned within a range of 0.1 mm or more to 1.0 mm or less from the surface of the rotary table apparatus.

10. The device of claim 1, wherein the light receiver includes a CCD.

11. The device of claim 1, wherein the rotary table is provided in a process container, and
the light transmitter and the light receiver are provided outside the process container.

12. A substrate processing apparatus, comprising:
a process container;
a rotary table disposed in the process container and having a substrate loading region on its upper surface along a circumferential direction;
a processing gas supply part configured to supply a processing gas onto the rotary table; and
the substrate warpage detection device of claim 1.

13. A substrate warpage detection method, comprising:
rotating a rotary table in a state in which a substrate is loaded on a substrate loading region having a recess shape formed on an upper surface of the rotary table along a circumferential direction;
transmitting a light beam obliquely upward from a side of the rotary table such that a lower portion of the light beam collides with an upper end of a side surface of the rotary table and an upper portion of the light beam positioned more upward than the lower portion of the light beam passes a portion near a surface of the rotary table; and receiving the light beam and detecting an amount of received light of the light beam, wherein the light beam is transmitted such that, when the substrate loaded on the substrate loading region protrudes upward from the surface of the rotary table by a predetermined height, the amount of received light of the light beam is detected as a value less than a predetermined threshold value.

14. The method of claim 13, further comprising a step of shielding an upper end portion of the light beam between the step of transmitting a light beam and the step of detecting the amount of received light of the light beam.

15. The method of claim 13, further comprising decelerating or stopping the rotary table when it is detected that the amount of received light of the light beam is zero.

16. The method of claim 13, wherein the substrate loading regions is a plurality of the substrate loading regions disposed on the rotary table along the circumferential direction, and the light beam is transmitted so as to pass over the plurality of substrate loading regions.

17. The method of claim 13, wherein when a height of the surface of the rotary table is locally different, a relation between the predetermined height of the substrate, the amount of received light of the light beam and the threshold value is determined with respect to with the substrate loading region whose surface of the rotary table is the lowest.

18. The method of claim 13, wherein the predetermined height is set to a height at which the substrate is not detached from the substrate loading region and a possibility of detachment occurs when the substrate exceeds the predetermined height.

19. The method of claim 13, wherein the light beam is transmitted such that, when the substrate loaded on the substrate loading region protrudes from the surface of the rotary table by the predetermined height, it is detected that the amount of received light of the light beam is zero.

20. A substrate processing method comprising:

supplying a processing gas onto the upper surface of the rotary table; and performing the substrate warpage detection method of claim 13 while processing the substrate loaded on the upper surface of the rotary table.

* * * * *